United States Patent
Sugimoto

(10) Patent No.: US 9,577,753 B2
(45) Date of Patent: Feb. 21, 2017

(54) TRANSIMPEDANCE AMPLIFIER

(71) Applicant: SUMITOMO ELECTRIC INDUSTRIES, LTD., Osaka (JP)

(72) Inventor: Yoshiyuki Sugimoto, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 14/747,465

(22) Filed: Jun. 23, 2015

(65) Prior Publication Data
US 2015/0372648 A1 Dec. 24, 2015

(30) Foreign Application Priority Data

Jun. 24, 2014 (JP) ................. 2014-128850

(51) Int. Cl.
H03F 3/08 (2006.01)
H04B 10/079 (2013.01)
H03F 1/08 (2006.01)
H03F 3/45 (2006.01)

(52) U.S. Cl.
CPC .......... H04B 10/0797 (2013.01); H03F 1/083 (2013.01); H03F 3/08 (2013.01); H03F 3/45475 (2013.01); H03F 2200/375 (2013.01); H03F 2200/453 (2013.01); H03F 2200/462 (2013.01); H03F 2203/45288 (2013.01)

(58) Field of Classification Search
CPC ...................................................... H03F 3/08
USPC ..................................... 330/308; 250/214 A
See application file for complete search history.

(56) References Cited

U.S. PATENT DOCUMENTS

| | | | |
|---|---|---|---|
| 6,342,694 B1 * | 1/2002 | Satoh ................. | H04B 10/6911 250/214 A |
| 6,778,021 B2 * | 8/2004 | Denoyer ................... | H03F 3/08 250/214 A |
| 7,202,732 B2 * | 4/2007 | Davies .................... | H03F 3/087 330/308 |
| 7,525,391 B2 * | 4/2009 | Denoyer ................... | H03F 3/08 330/308 |
| 8,395,444 B2 * | 3/2013 | Hara .................... | H03G 3/3084 330/141 |
| 8,742,852 B2 * | 6/2014 | Sugimoto ............... | H03F 3/087 330/252 |
| 9,035,696 B2 * | 5/2015 | Sugimoto ............... | H03F 3/087 330/259 |

FOREIGN PATENT DOCUMENTS

| | | |
|---|---|---|
| JP | H11-040840 | 2/1999 |
| JP | 2009-260300 | 11/2009 |

* cited by examiner

*Primary Examiner* — Henry Choe
(74) *Attorney, Agent, or Firm* — Smith, Gambrell, & Russell, LLP.

(57) ABSTRACT

A TIA comprises a TIA core that converts a current signal to a voltage signal, a single-to-differential converter that generates a differential voltage signal from the voltage signal, a feedback circuit that generates a control signal from the differential voltage signal, a bypass circuit that generates the current signal by subtracting the bypass current from the input current so that an average value of the current signal is maintained at a predetermined value, and a monitor circuit that generates a monitor current proportional to the bypass current from the control signal.

11 Claims, 7 Drawing Sheets

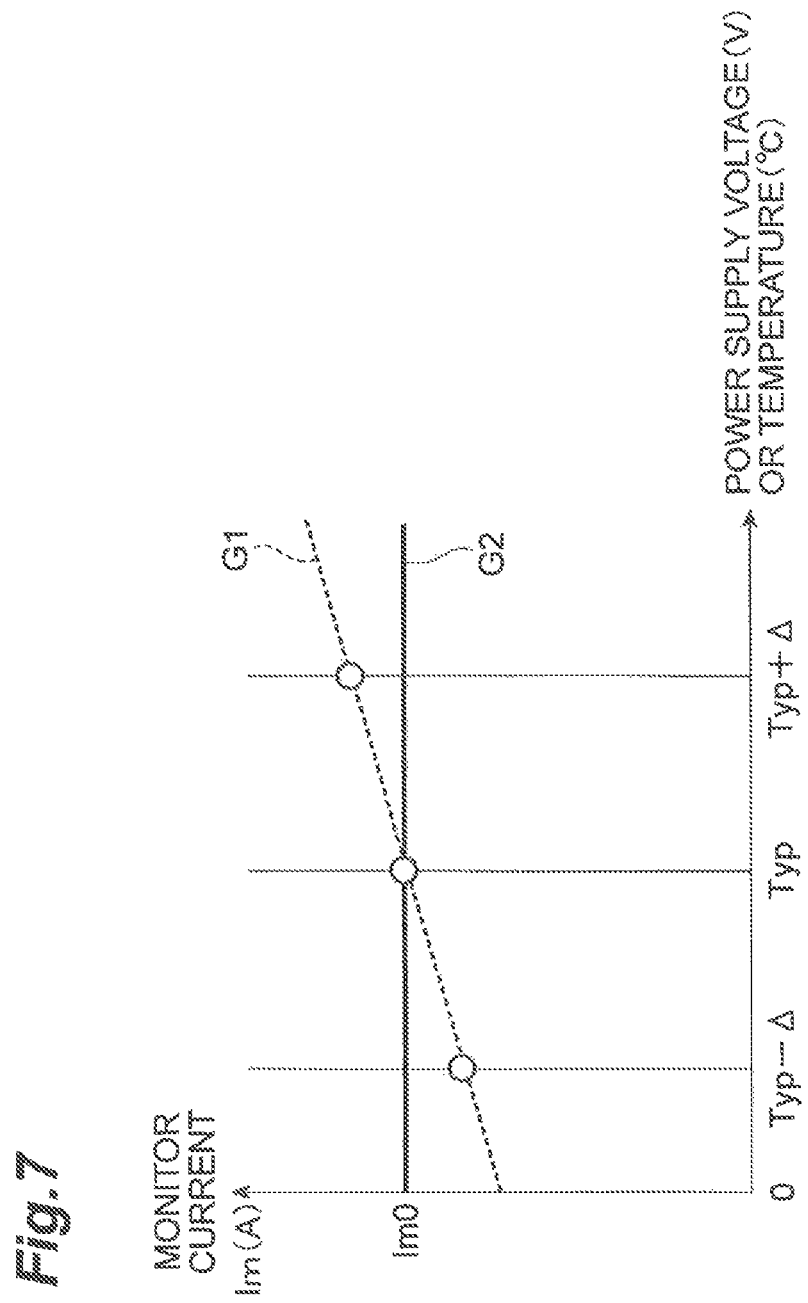

TRANSIMPEDANCE AMPLIFIER

TECHNICAL FIELD

The present invention relates to a transimpedance amplifier used for an optical receiver or the like.

BACKGROUND

As a traffic of a communication network drastically increases, there has been a continuous demand for downsizing and power saving of an optical transceiver. A reception part of the optical transceiver includes a photodetector such as a photodiode (PD) which converts an optical signal into a current signal (photocurrent), and a transimpedance amplifier (TIA) which converts the current signal into a voltage signal and amplifies the voltage signal. The current signal generated by the PD is not only used to demodulate a signal modulated by a transmission part of the optical transceiver but also used to monitor an intensity of a received optical signal and detect a no signal (loss of signal) state.

An example of a configuration for monitoring the intensity of the optical signal is disclosed in Japanese Patent Application Laid-Open No. 11-40840 in which a current mirror circuit connected in series with a PD is used for a current monitoring circuit. Another current monitoring circuit is disclosed in Japanese Patent Application Laid-Open No. 2009-260300 in which an amount of a current signal is calculated from a voltage drop generated at a resistor connected in series with a PD.

The current mirror circuit mentioned above needs a PNP-type bipolar transistor, a P-channel FET (Field Effect Transistor), or the like. On the other hand, the transimpedance amplifier is configured to include an NPN-type bipolar transistor in order to secure high speed performance. Generally, since the PNP-type and NPN-type bipolar transistors are difficult to integrate on the same chip, each type of transistor should be manufactured on a separate chip. This is not preferable in terms of the downsizing of the transimpedance amplifier. Further, in the configuration including the current mirror circuit, a transistor needs some voltage between an emitter and a collector of the transistor, which is not preferable to reduce power consumption. Similarly, also in the configuration having the resistor connected in series with a PD, a large supply voltage is necessary to generate the voltage drop at the resistor. Such a large supply voltage is not preferable in terms of the power saving.

SUMMARY

In one aspect, the present invention relates to a transimpedance amplifier. The transimpedance amplifier comprises a first amplifier configured to convert a current signal to a voltage signal, a single-to-differential converter configured to generate a differential voltage signal from the voltage signal, a feedback circuit configured to generate a control signal from the differential voltage signal, a bypass circuit configured to generate the current signal by subtracting the bypass current from the input current so that an average value of the current signal is maintained at a predetermined value, and a monitor circuit configured to generate a monitor current proportional to the bypass current from the control signal.

BRIEF DESCRIPTION OF THE DRAWINGS

FIG. 7 is a diagram showing changes of a monitor current against a deviation from a typical condition.

DETAILED DESCRIPTION

Details of Embodiments of the Present Application Invention

First Embodiment

Figure 1A:
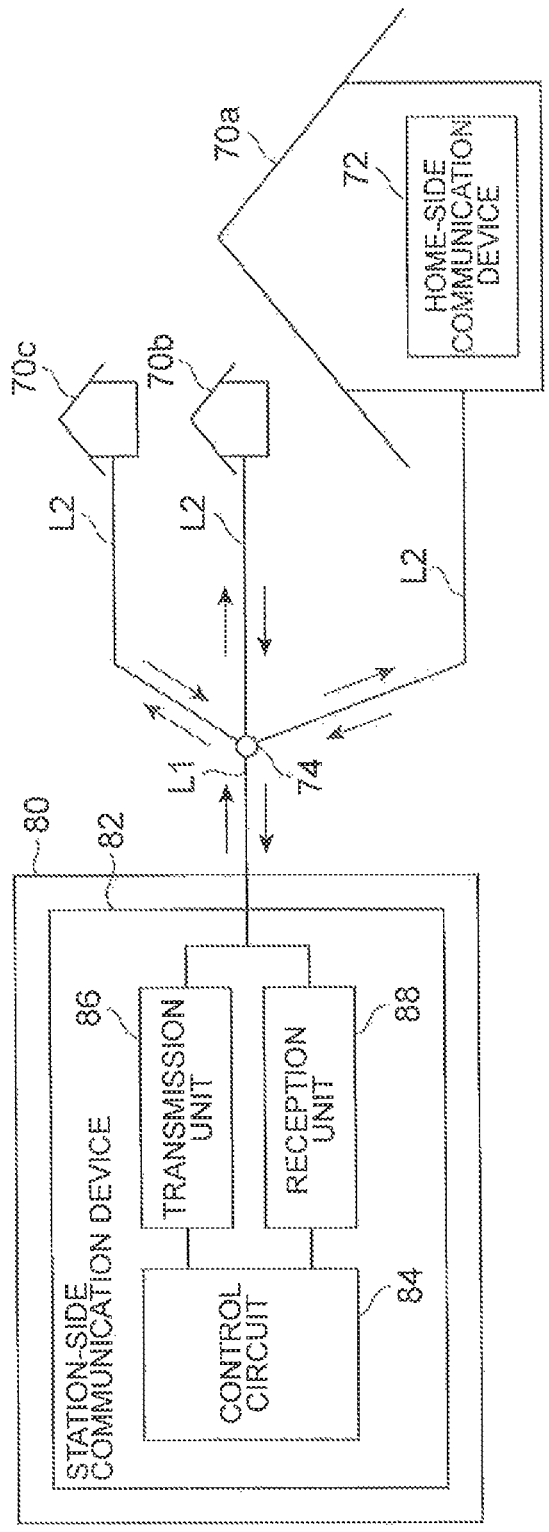
FIG. 1A is a block diagram illustrating a PON system.

First, a PON (Passive Optical Network) system is described as an example of a communication system according to the first embodiment of the invention. FIG. 1A is a block diagram of the PON system. An OLT (Optical Line Terminal) 82 in a station 80 is coupled with, for example, each of ONUs (Optical Network Units) 72 in a plurality of homes 70a to 70c via communication lines L1 and L2 that are optical fibers. The OLT 82 and an optical splitter 74 are connected with each other via one communication line L1. The optical splitter 74 and each ONU 72 are connected via each communication line L2. The optical signal input to the optical splitter 74 from the OLT 82 via the communication line L1 is distributed to each ONU 72 via each communication line L2, and the optical signals output from the respective ONUs 72 to the optical splitter 74 via the respective communication lines L2 are combined at the optical splitter 74 and transmitted to the OLT 82 via the communication line L1. The OLT 82 has a control circuit 84, a transmission unit (transmitter) 86, and a reception unit (receiver) 88. The transmission unit 86 transmits the optical signal to each ONU 72. The reception unit 88 receives the optical signal from each ONU 72. The control circuit 84 controls the transmission unit 86 and the reception unit 88. The optical signal transmitted from the transmission unit 86 and the optical signal received by the reception unit 88 have wavelengths different from each other.

Figure 1B:
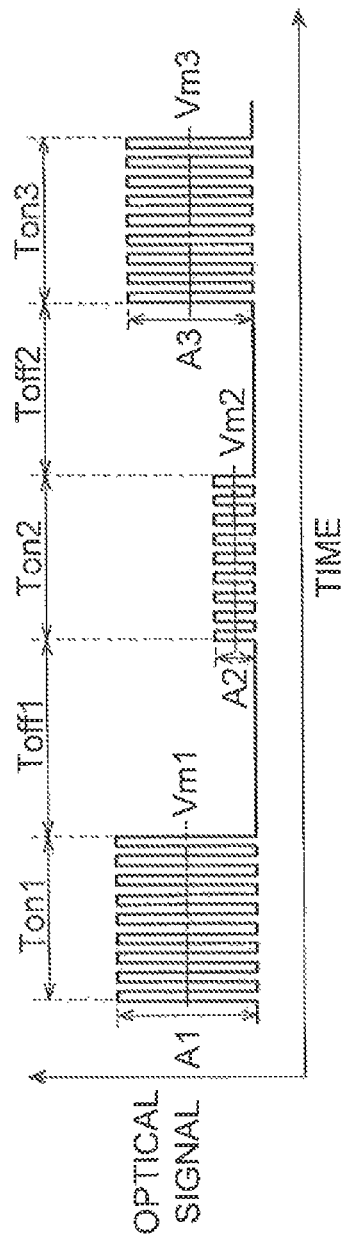
FIG. 1B is an example of waveforms of optical signals received by the reception unit in FIG. 1.
Figure 2:
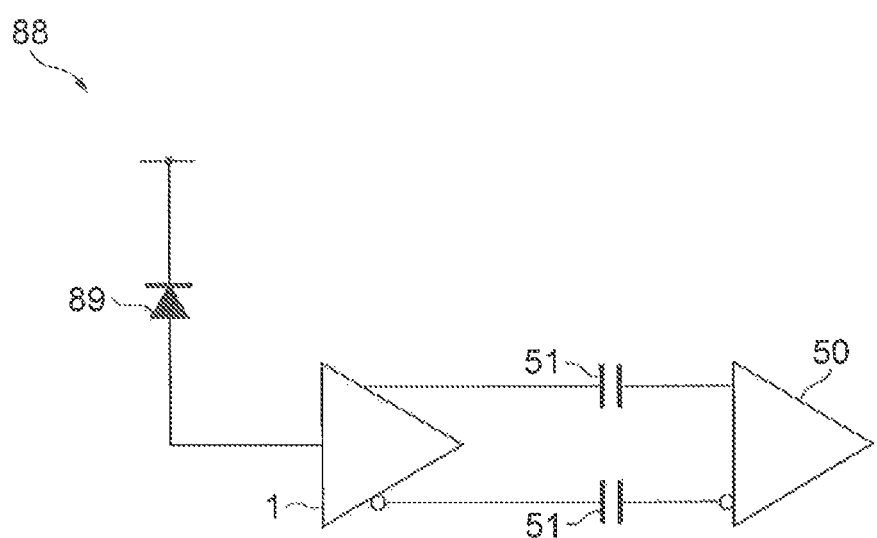
FIG. 2 is a diagram illustrating an exemplary configuration of the reception unit in FIG. 1.

FIG. 1B is an example of waveforms of the optical signal input to the photodetector 89 in the reception unit 88 (see FIG. 2). During a period Ton1, the optical signal is input from the ONU 72 of the home 70a. During a period Toff1, the optical signal is not input, and during a period Ton2, the optical signal is input from the ONU (not shown) of the home 70b. Further, during a period Toff2, the optical signal is not input, and during a period Ton3, the optical signal is input from the GNU (not shown) of the home 70c. Amplitudes of output signals from the ONUs 72 and optical losses of the communication lines L2 are different from each other. The optical loss of the communication lines L2 depends on a distance, namely a length of each optical fiber, between the optical splitter 74 and each ONU 72. For this reason, the amplitudes of the optical signals during the periods Ton1, Ton2, and Ton3 (input signal periods) are different from each other shown as the amplitudes A1, A2, and A3 respectively. In this way, the optical signals are irregularly input with the different amplitudes to the reception unit 88 from the different homes. Note the periods Toff1 and Toff2 (interval periods) are necessary for switching the optical signals. Since the amplitudes of the input optical signals are different, a feedback circuit is used in an amplifier circuit of the reception unit 88.

Next, a configuration of the reception unit 88 included in the OLT 82 is described. FIG. 2 is a diagram showing an exemplary configuration of the reception unit (receiver) 88 in FIG. 1. The reception unit 88 is, for example, a 10G-EPON (10 Gigabit Ethernet Passive Optical Network) receiver. The reception unit 88 includes the photodetector 89, a transimpedance amplifier (TIA) 1, and a limiting amplifier (LIA) 50.

The photodetector 89 is an element for converting the optical signal input to the reception unit 88 into an electrical signal, more specifically, the current signal (photocurrent). The photodetector 89 is an avalanche photodiode (APD), for example. The current signal output by the photodetector 89 is input to the TIA 1.

The TIA 1 is an IC (Integrated Circuit) which converts a current signal to a voltage signal with amplifying an amplitude of the voltage signal. The TIA 1 operates with a high gain when intensity of the input signal is relatively weak and operates with a low gain when intensity of the input current signal is relatively strong. Thus, the TIA 1 automatically controls the gain according to intensity of the input signal. A differential signal (voltage signal) amplified by the TIA 1 is input to the LIA 50. The respective output terminals of the TIA 1 are coupled with the respective input terminals of the LEA 50 through a capacitor 51. A relatively small capacitance is used for the capacitor 51 in order to attain a high speed responsivity for a burst signal (discontinuous signal with, interval periods) in comparison with a capacitor used for a reception unit (receiver) of a trunk line system or the like, which mainly receives a continuous signal. Details of the TIA 1 are described later.

The LIA 50 is an IC for converting the voltage signals having various intensities into the voltage signal having a fixed amplitude and outputting the converted voltage signal. The LIA 50 equalizes a voltage levels of a positive phase signal of the differential signal with a voltage level of a negative phase signal of the differential signal. A CDR (Clock and Data Recovery) (not shown) extracts a clock signal from the voltage signal having the fixed amplitude output from the LIA 50 and reshapes waveforms of the voltage, signal by performing a regenerating process with the extracted clock signal containing less jitter.

Figure 3:
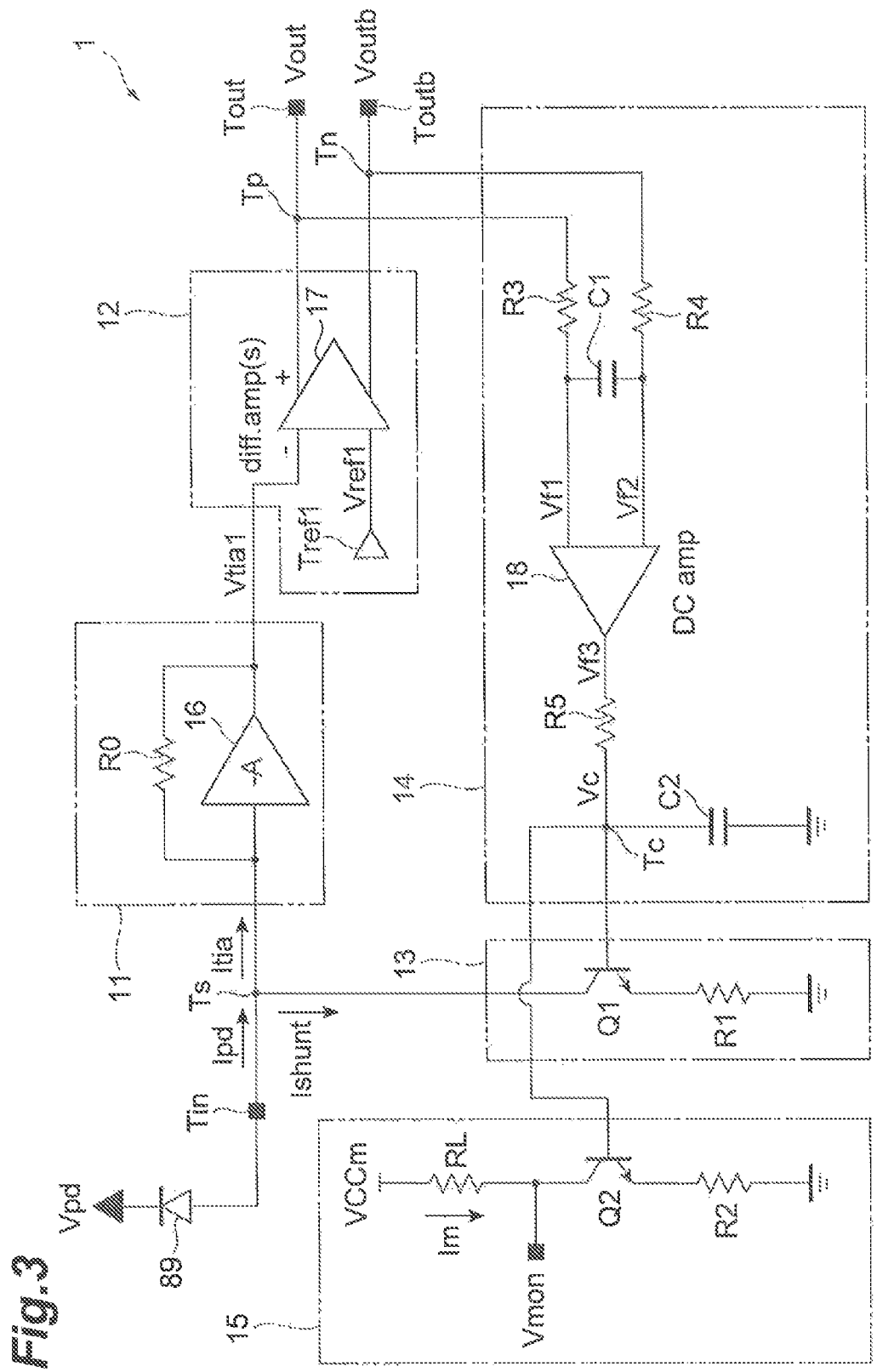
FIG. 3 is a circuit diagram of a transimpedance amplifier according to a first embodiment.

Next, the TIA 1 of the first embodiment is described in detail. FIG. 3 is a circuit diagram of the TIA 1 according to the first embodiment. As shown in FIG. 3, the TIA 1 includes a TIA core 11 (first amplifier), a single-to-differential converter 12, a bypass circuit 13, a feedback circuit 14, and a monitor circuit 15. An input terminal Tin is connected with an anode of the photodetector 89. A cathode of the photodetector 89 is connected to a supply voltage Vpd. An input current Ipd input to the input terminal Tin is to be an input signal (current signal) Itia to the TIA core 11 (described later in detail), when the bypass circuit 13 is unactivated The TIA 1 is configured to include a plurality of NPN-type transistors.

The TIA core 11 includes an amplifier 16 and a feedback resistor R0, and converts the current signal Itia into a voltage signal Vtia1 to output the voltage signal Vtia1 to the single-to-differential converter 12. More specifically, the TIA core 11 generates a voltage signal Vtia1 which intensity depends on the current signal Itia obtained by subtracting a bypass current Ishunt from the input current Ipd. The TIA core 11 inverts logic of the voltage signal Vtia1, because the voltage signal Vtia1 has a reference level of a positive voltage, for instance, supply voltage VCC. Therefore, the voltage signal Vtia1 becomes a lower level when the current signal Itia becomes larger (but the amplitude of the voltage signal Vtia1 corresponding to VCC-Vtia1 becomes larger), and the voltage signal Vtia1 becomes a higher level when the current signal Itia becomes smaller (but the amplitude VCC-Vtia1 becomes smaller). Note that whether the TIA core 11 inverts logic of the voltage signal Vtia1 or not is related to a circuit structure of the TIA core 11. Therefore, there can be another variation in which the TIA core 11 does not invert the logic.

The single-to-differential converter 12 generates complementary voltage signals Vout and Voutb whose amplitudes depend on the voltage signal Vtia1. The complementary voltage signals Vout and Voutb are practically treated as a differential voltage signal Vout-Voutb, because a difference between the positive phase component Vout and the negative phase component Voutb has a meaning of signal for differential circuits. The single-to-differential converter 12 includes a differential amplifier 17 that has a positive phase input (non-inverting input) and a negative phase input (inverting input) and generates the complementary voltage signals Vout and Voutb whose amplitudes depend on a voltage difference between the positive phase input and the negative phase input. The differential amplifier 17 amplifies a difference between the voltage signal Vtia1 output from the TIA core 11 to the positive phase input and a reference voltage Vref1 applied to a reference voltage terminal Tref1 connected with the negative phase input, that is, Vtia1−Vref1. For example, in the differential amplifier 17, when the voltage signal Vtia1 is equal to the reference voltage signal Vref1, the complementary voltage signals Vout and Voutb are equal, which voltage is defined as a center voltage Vcenter=Vout=Voutb. Then, the voltage signal Vtia1 moves to a voltage level lower than the reference voltage signal Vref1 (corresponding to a large amplitude of the current signal Itia), the differential amplifier 17 outputs the complementary voltage signal Vout larger than the center voltage Vcenter to an output terminal Tout, and the complementary voltage signal Voutb smaller than the center voltage Vcenter to the output terminal Toutb. When the voltage signal Vtia1 moves to a level higher than the reference voltage signal Vref1 (corresponding to a small amplitude of the current signal Itia), the differential amplifier 17 outputs the complementary voltage signal out smaller than the center voltage Vcenter to the output terminal Tout, and the complementary voltage signal Voutb larger than the center voltage Vcenter to the output terminal Toutb. The complementary voltage signals Vout and Voutb have phases different from each other by 180 degrees.

The bypass circuit 13 subtracts the bypass current Ishunt from the input current Ipd before flowing in the TIA core 11 in order to generate a current signal Itia=Ipd−Ishunt. The bypass current is controlled by a control signal Vc (described later in detail) output from the feedback circuit 14. The bypass circuit 13 includes a transistor Q1, for example an NPN-type transistor, and a resistor R1. A collector of the transistor Q1 is connected with a terminal Ts and an emitter of the transistor Q1 is grounded through a resistor R1. The control signal Vc output from the feedback circuit 14 is input to a base of the transistor Q1. The bypass circuit 13 bypasses (shunts) a part of the input current Ipd as the bypass current Ishunt depending on a voltage of the control signal Vc.

In this way, the bypass circuit 13 bypasses a part of the input signal Ipd based on the control signal Vc. Since a part of the input signal Ipd is bypassed, an average value of the current signal Itia input to the TIA core 11 decreases in comparison with the input signal. Ipd. In other words, the bypass circuit 13 is controlled by the feedback circuit 14 to increase the bypass current Ishunt in order to decrease the time average value of the current signal Itia input to the TIA core 11 when the voltage signal Vtia1 becomes small (the input signal Ipd becomes large). Note that the amplitude of the voltage signal Vtia, namely a difference between the supply voltage. VCC and the voltage signal Vtia, becomes large when the voltage signal Vtia becomes low (small).

The feedback circuit 14 is an automatic control circuit that generates the control signal Vc for maintaining the average value of the current signal Itia at a predetermined value based on the differential voltage signal (constituted by the complementary voltage signals Vout and Voutb) output from the single-to-differential converter 12. The feedback circuit 14 includes a filter having a resistor R3, a resistor R4, a capacitor C1, and a DC amplifier 18. The complementary voltage signal Vout is input to the resistor R3 from a terminal Tp. The complementary voltage signal Voutb is input to the resistor R4 from a terminal Tn. A circuit network constituted by the resistors R3 and R4 and the capacitor C1 passes low frequency components of the complementary voltage signals Vout and Youth to be output to the DC amplifier 18 as input voltage signals Vf1 and Vf2, respectively. The DC amplifier 18 generates an output voltage signal Vf3 based on the input voltage signals Vf1 and Vf2. Then, the output voltage signal Vf3 is passed through a filter constituted by a resistor R5 and a capacitor C2 to generate the control signal Vc.

The monitor circuit 15 generates a monitor current Im, which is proportional to the bypass current Ishunt, depending on the control signal Vc. The monitor circuit 15 includes a transistor Q2, a resistor R2, a resistor RL, and a supply voltage VCCm. The transistor Q2 is an NPN-type transistor, for instance. The transistor Q2 is the same transistor (has the same characteristics) as the transistor Q1 of the bypass circuit 13 described above, and the resistor R2 is the same resistor as the resistor R1 of the bypass circuit 13 described above, An emitter of the transistor Q2 is grounded through the resistor R2. A base of the transistor Q2 is connected with a terminal Tc which is connected with the base of the transistor Q1, and thus, the control signal Vc is input to both a base of the transistor Q2 and the base of the transistor Q1. A collector of the transistor Q2 is connected the supply voltage VCCm through the resistor RL.

In the above configuration, the monitor current Im flowing in the monitor circuit 15 can be derived by measuring a voltage of a terminal Vmon between the resistor RL and the collector of the transistor Q2, and dividing a difference between the supply voltage VCCm and the voltage of terminal Vmon, that is, a voltage drop at the resistor RL, by resistance of the resistor RL. Since the monitor current Im depends on the control signal Vc which determines the bypass current subtracted from the input current Ipd by the bypass circuit 13, the monitor current Im is set to a value linearly depending on (proportional to) the bypass current Ishunt. Here, since the control signal Vc is adjusted such that the average value of the current signal Itia is maintained at a predetermined value, the bypass current Ishunt depends on a magnitude of the input signal Ipd before flowing in the TIA core 11. Therefore, the monitor current Im also depends on the magnitude of the input signal Ipd before flowing in the TIA core 11, and this enables to monitor the magnitude of the input signal Ipd by measuring the voltage Vmon as described in the following.

Since the transistor Q2 of the monitor circuit 15 has the same characteristics as the transistor Q1 of the bypass circuit 13 and the resistor R2 of the monitor circuit 15 set to the same resistance as the resistor R1 of the bypass circuit 13, the monitor current Im becomes substantially equal to the bypass current Ishunt. Therefore, a relationship between the monitor current Im, the bypass current Ishunt, the input signal Ipd, and the current signal Itia is represented by formula (1).

$$Im = I\text{shunt} = Ipd - Itia \qquad (1)$$

Here, assuming a value of the bypass current Ishunt is Ishunt0 and the monitor current Im is Im0 when the input signal is null Ipd=0 (with no input), $$Itia = -I\text{shunt}0 = -Im0 \qquad (2)$$

is obtained, and $$Im = Ipd + I\text{shunt}0 = Ipd + Im0 \qquad (3)$$

is found from formulae (1) and (2).

Therefore, by finding the monitor current Im0 when the input signal is null Ipd=0, the input signal Ipd can be derived from the relevant Im0 and the derived monitor current Im, based on a formula Ipd=Im−Im0.

Next, the action and effect of the TIA 1 according to the embodiment is described.

In the TIA 1 according to the embodiment, the monitor current Im depending on the control signal Vc flows in the monitor circuit 15. The relevant control signal Vc is also used for determining the bypass current Ishunt, and thus, the monitor current Im becomes a value linearly depending on (proportional to) the bypass current Ishunt (in the embodiment, since the transistor Q2 of the monitor circuit 15 has the same characteristics as the transistor Q1 of the bypass circuit 13 and the resistor R2 of the monitor circuit 15 has the same resistance as the resistor R1 of the bypass circuit 13, the monitor current Im is substantially equal to the bypass current Ishunt). Additionally, since the control signal Vc is controlled by the feedback circuit 14 such that the average value of the current signal Itia flowing in the TIA core 11 is maintained at a predetermined value, the bypass current Ishunt depends on the input signal Ipd before flowing in the TIA core 11. Therefore, the monitor current Ina depends on the input signal Ipd. Thus, by monitoring the relevant monitor current Im, the intensity of the optical signal which the reception unit 88 including the TIA 1 receives is properly detected.

Figure 4:
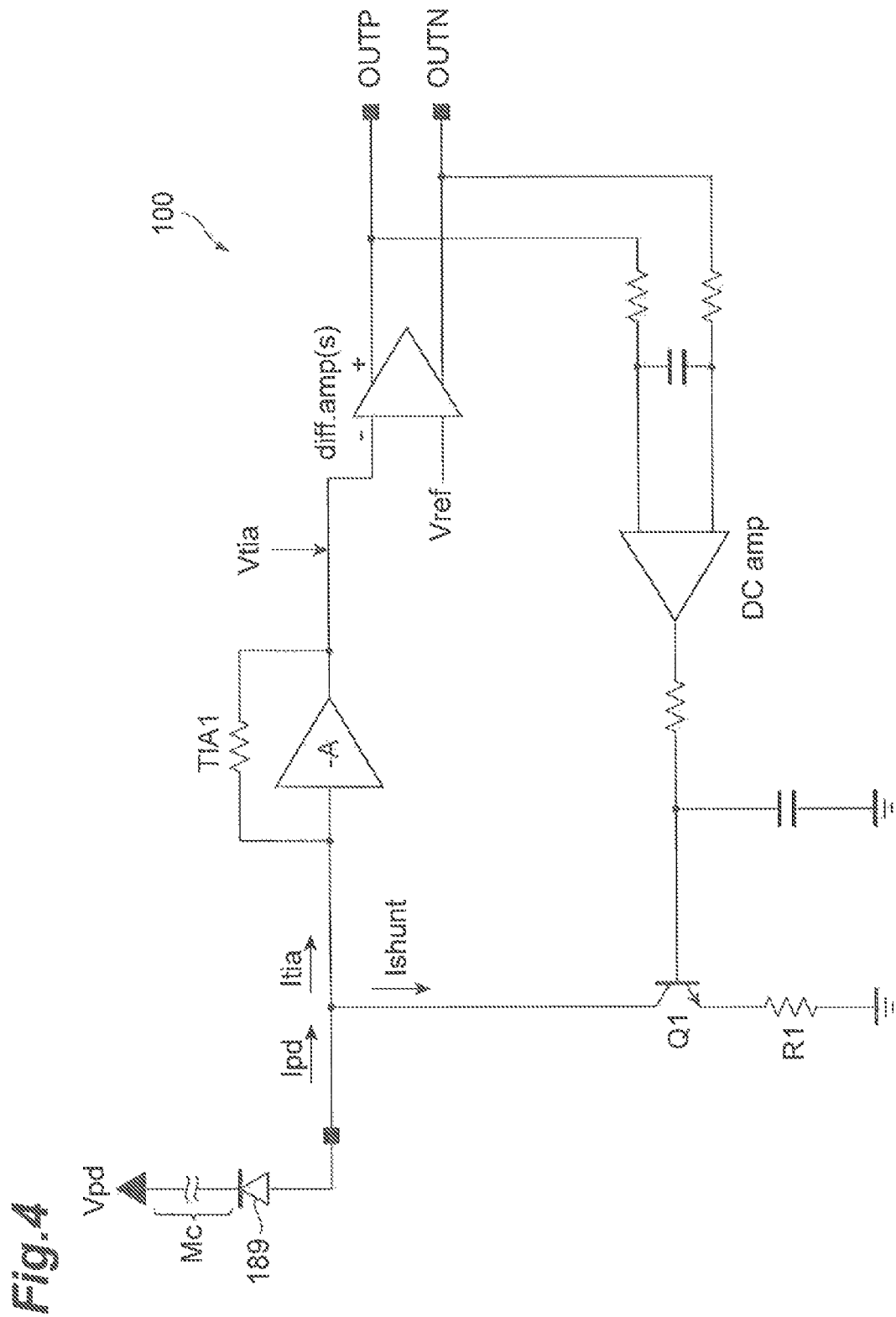
FIG. 4 is a circuit diagram of a transimpedance amplifier according to a comparative example.

For example, in a TIA 100 according to a comparative example shown in FIG. 4, a circuit for measuring the intensity of the optical signal is not provided in the TIA 100. For this reason, in the TIA 100, a monitor circuit MC (e.g., current mirror circuit or resistor) for measuring the intensity of the optical signal is connected in series on the cathode side of a PD 189, and is used to monitor the photocurrent corresponding to the intensity of the optical signal. The reception unit including the TIA 100 with such a series circuit in which an element is connected with the cathode of the PD in series may need more space. Accordingly, the size of the reception unit may be increased. For example, the current mirror circuit with a PNT-type bipolar transistor to be connected on the cathode side of the PD 189, can not be integrated on the same chip as the TIA 100 constituted by the NPN-type bipolar transistors, because PNP-type bipolar transistor and NPN-type bipolar transistor require semiconductor processes different from each other. Therefore, increase of the number of chips causes increase in size. Further, a series circuit with an element connected to the cathode of the PD 189 in series requires a larger supply voltage, because some voltage should be given to the element. However, such a larger supply voltage is not preferable also in terms of the power saving.

In this view, since the monitor current Im controlled by the control signal Vc in the TIA 1 eliminates necessity for connecting the current mirror circuit or the resistor in series on the cathode side of the PD as in the TIA 100, the downsizing and power saving of the reception unit 88 can be achieved as compared with the TIA 100.

Second Embodiment

Next, a TIA 1A according to a second embodiment is described with reference to FIG. 5. Note that the description of this embodiment mainly describes points different from the above embodiment.

Figure 5:
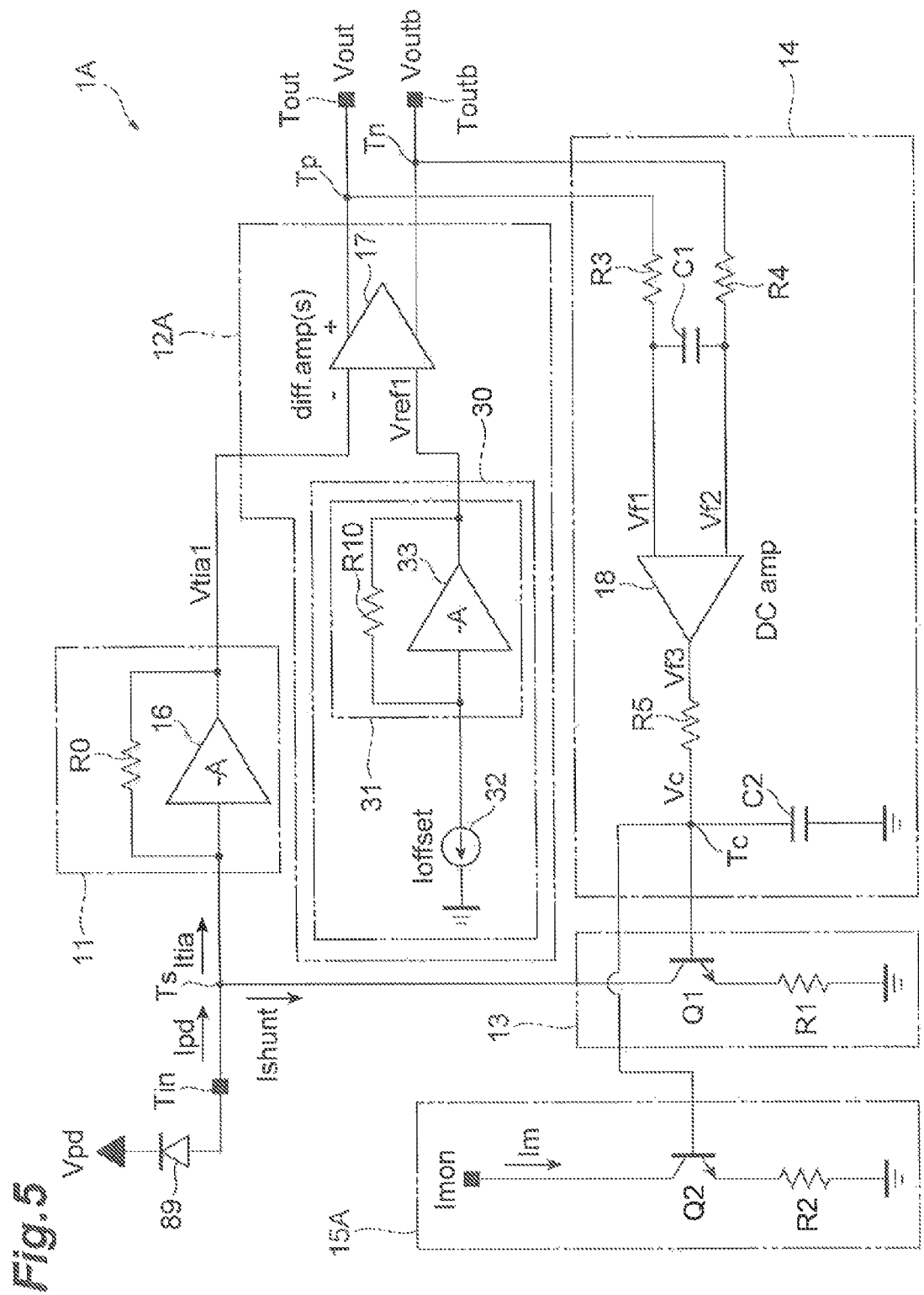
FIG. 5 is a circuit diagram of a transimpedance amplifier according to a second embodiment.

FIG. 5 is a circuit diagram of the TIA 1A according to the second embodiment. As shown in FIG. 5, the TIA 1A includes a single-to-differential converter 12A in place of the single-to-differential converter 12 in the TIA 1 according to the first embodiment and a monitor circuit 15A in place of the monitor circuit 15. The monitor circuit 15A is similar to the monitor circuit 15 in a point of having the current source which generates the monitor current Im depending on the control signal Vc, but is different in a point that the monitor circuit 15A directly provides the monitor current Im whereas the monitor circuit 15 provides the voltage drop to derive the magnitude of the monitor current Im. Hereinafter, the single-to-differential converter 12A is described in detail.

The single-to-differential converter 12A has, similarly to the single-to-differential converter 12, the differential amplifier 17. To the differential amplifier 17, the voltage signal Vtia1 described above is input as the negative phase component of the differential input signal and the reference voltage Vref1 is input as the positive phase component of the differential input signal. The reference voltage Vref1 input to the differential amplifier 17 is output from the offset circuit 30. The offset circuit 30 outputs the reference voltage Vref1 such that the bypass current Ishunt is maintained at a predetermined value when the input signal Ipd is null. Note that the circuit operation is the same except for an inverted logic of the differential voltage signal, even when the voltage signal Vtia1 is input as the positive phase component of the differential input and the reference voltage Vref1 is input as the negative phase component of the differential input signal.

The offset circuit 30 includes a dummy TIA core 31 (second amplifier) and an offset current source 32. The dummy TIA core 31 has input-output characteristics (functions, characteristics) equivalent to those of the TIA core 11. In other words, an amplifier 33 of the dummy TIA core 31 has the same circuit structure as the amplifier 16 of the TIA core 11, and a feedback resistor R10 of the dummy TIA core 31 has the same resistance as the feedback resistor R0 of the TIA core 11.

The dummy TIA core 31 generates the reference voltage Vref1 from an offset current Ioffset. As described above, since the dummy TIA core 31 has the input-output characteristics equivalent to those of the TIA core 11, the offset current Ioffset is substantially equal to the bypass current Ishunt0 defined when the input signal Ipd is null. When the input current Ipd is null (Ipd=0), the current signal Itia becomes Itia=−Ishunt0 according to the formula (2). Suppose that the differential amplifier 17 has a very large gain and also the feedback loop constituted by the first amplifier 11, the single-to-differential converter 12A, the feedback circuit 14, and the bypass circuit 13 has a very large loop gain, the TIA 1A reaches a steady state that the input signal of the TIA core 11 (first amplifier) and the input signal of the dummy TIA core 31 (second amplifier) are equalized as Itia=−Ioffset=−Ishunt0 when the imput current Ipd is null (Ipd=0). Therefore, the bypass current Ishunt0 when the imput current is null is set to a predetermined value Ioffset and is maintained automatically. Further, the monitor circuit 15 generates the monitor current Im satisfying a formula, Ipd=Im−Ioffset. When the offset current Ioffset is constant against variations of supply voltage and temperature, the intensity of the input current is calculated from the monitor current Im.

Figure 6A:
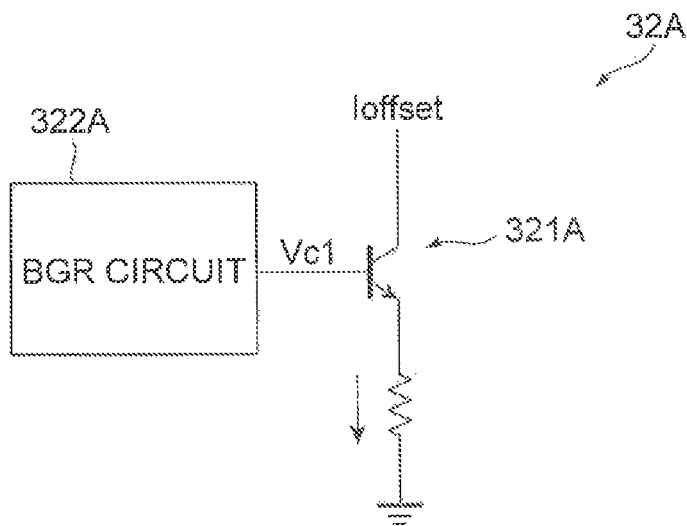
FIG. 6A is a diagram of an exemplary configuration of an offset current source.
Figure 6B:
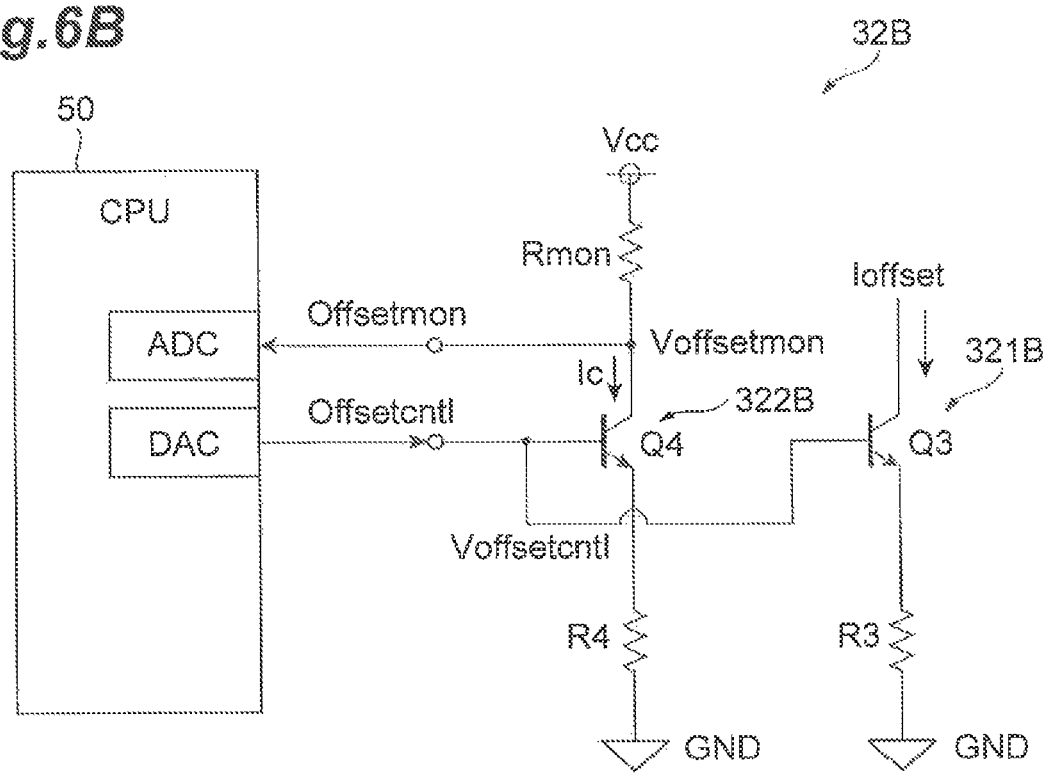
FIG. 6B is a diagram of another exemplary configuration of an offset current source.

The offset current source 32 generates the offset current Ioffset and drains the offset current Ioffset from the input terminal of the dummy TIA core 31. Examples of the offset current source 32 are described with reference to FIGS. 6A and 6B. FIG. 6A is a diagram of an offset current source 32A that shows an exemplary configuration of the offset current source 32. FIG. 6B is a diagram showing an offset current source 32B that shows another exemplary configuration of the offset current source 32.

As shown in FIG. 6A, the offset current source 32A has a current source 321A (first current source) that generates the offset current Ioffset depending on a control voltage Vc1 (first control voltage), and a BGR (Band Gap Reference) circuit 322A (constant voltage circuit) that generates the above control voltage Vc1. The BGR circuit 322A generates the control voltage Vc1 having any temperature dependence by, for example, adding a voltage having some temperature dependence to another voltage having an opposite temperature dependence at any ratio, as a kind of compensation. This allows the offset current source to form the offset current Ioffset independent of the supply voltage and temperature. Further, by using the BGR circuit 322A like this, for example, even when the dummy TIA core 31 and the TIA core 11 have the configurations different from each other (the input-output characteristics thereof are somewhat different from each other) in order to reduce the power consumption, the bypass current Ishunt can be adjusted to a desired value.

As shown in FIG. 6B, the offset current source 32B has a current source 322B (second current source) that generates a control current Ic depending on a control voltage Voffsetcnt1 (second control voltage) and a current source 321B (another first current source) that generates the offset current Ioffset depending on the control voltage Voffsetcnt1. The current source 322B includes a transistor Q4 and a resistor R4 connected in series with each other and the current source 321B includes a transistor Q3 and a resistor R3 connected in series with each other. Since the transistors Q4 and Q3 have the same characteristics and the resistors R3 and R4 have the same resistance, the input-output characteristics of the current sources 321B and 322B are equivalent to each other (substantially equal).

The control voltage Voffsetcnt1 for the offset current source 322B is adjusted by, for example, a CPU 50 (control circuit) built in the reception unit 88, The currents almost equivalent to each other (control current Ic=offset current Ioffset) flow in the transistor Q4 of the current source 322B and the transistor Q3 of the current source 321B based on the same control voltage Voffsetcnt1 input from an offset control terminal Offsetcnt1 which connects the CPU 50 and the offset current source 32B.

A collector of the transistor Q4 in the current source 322B is connected with a resistor Rmon and the relevant resistor Rmon is connected with a supply voltage Vcc. In the relevant configuration, an offset monitor terminal Offsetmon connecting the CPU 50 and the offset current source 322B is connected at a node between the resistor Rmon and the collector of the transistor Q4. The CPU 50 derives the control current Ic flowing in the transistor Q4 by monitoring a voltage Voffsetmon of the offset monitor terminal Offsetmon and dividing a difference between the supply voltage Vcc and the voltage Voffsetmon of the offset monitor terminal Offsetmon by the resistor Rmon. The CPU 50 adjusts the control voltage Voffsetcnt1 such that the control current Ic is maintained at a desired value (i.e., such that the offset current Ioffset is maintained at a desired value) depending on the derived control current Ic. In other words, the CPU 50 controls the derived control current Ic to adjust the offset current Ioffset to a desired value by using the feedback signal from the offset monitor terminal Offsetmon.

Note that the CPU 50 can take account of some temperature dependence, by measuring, for instance, the ambient temperature of the resistor Rmon by a temperature sensor not shown as well as the voltage Voffsetmon, to adjust the value of the offset current Ioffset to a desired value more accurately.

Next, the action and effect of the TIA 1A according to the embodiment is described.

The TIA 1A according to the embodiment includes the offset circuit 30 that generates the reference voltage signal Vref1 input to the differential amplifier 17. The offset circuit 30 generates the reference voltage Vref1 such that the bypass current Ishunt is maintained at a predetermined value when the input signal Ipd is null (Ipd=0). This allows the feedback circuit 14 to generate the control signal Vc by setting of the reference voltage signal Vref1 of the offset circuit 30, which makes it possible to easily and accurately derive the intensity of the optical signal. The offset circuit 30 may be incorporated into the single-to-differential converter 12A, and has such some flexibility of placement because the reference voltage Vref1 is a DC signal.

The offset circuit 30 has the dummy TIA core (second amplifier) 31 that generates the reference voltage Vref1 from the offset current Ioffset and the offset current circuit 32 that drains the offset current Ioffset from the dummy TIA core 31. Note that when an input signal to the dummy TIA core has a positive sign, the offset current circuit inputs a negative offset current −Ioffice to the dummy TIA. The input-output characteristics of the dummy TIA core 31 are substantially equal to the input-output characteristics of the TIA core 11, and the offset current Ioffset is substantially equal to the bypass current Ishunt0 when the input signal Ipd is null (Ipd=0), that is the monitor current Im0. This allows the intensity of the optical signal to be easily and accurately derived from the value of the offset current Ioffset set to the offset current circuit 32 and the monitor current Im on the basis of formula (3).

The offset current circuit 32A has the current source 321A that generates the offset current Ioffset depending on the control voltage Vc1 and the BGR circuit 322A that provides the above control voltage Vc1. This allows the offset current circuit 32A to have a configuration constituted by the NPN-type bipolar transistor and the resistor, and the configuration not requiring a large supply voltage.

The offset current circuit 32B has the current source 322B that generates the control current Ic depending on the control voltage Voffsetcnt1 and the current source 321B that generates the offset current Ioffset depending on the control voltage Voffsetcnt1. The input-output characteristics of the current sources 322B and 321B are substantially equal to each other. The control voltage Voffsetcnt1 is adjusted such that the control current Ic is maintained, at a predetermined value against variations of the voltage and temperature. This allows the constant control current Ic (i.e., the offset current Ioffset) to be compensated with the variations of the voltage and temperature being taken into account, which enables the offset current Ioffset to be constant independently of the voltage and temperature. This allows the bypass current Ishunt0 when the input signal Ipd is null, that is, the monitor current Im0, to be constant, which makes it possible to accurately derive the intensity of the optical signal from the offset current offset set to the offset current circuit 32 and the monitor current Im on the basis of formula (3).

As in a comparative example shown in FIG. 7 (graph G1 in FIG. 7), when the offset current Ioffset has the dependence regarding the voltage and temperature (hereinafter, referred to as "the temperature or the like"), the offset current Ioffset has to be set (corrected) under conditions Typ+Δ of deviating the temperature or the like toward the plus side and conditions Typ−Δ of deviating toward the minus side, which complicates the operation. On the other hand, when the offset current Ioffset of the offset current circuit 32B holds the constant value independently of the temperature or the like, the monitor current Im0 is constant (graph G2 in FIG. 7), and thus, the offset current Ioffset does not have to be set (corrected) plural times, which is superior in terms of manufacturability and manufacturing cost of the TIA 1.

As described above, the embodiments of the invention are described, but the invention is not limited to the above embodiments. For example, the description is given that the transistor Q2 of the monitor circuit 15 has the same characteristics as the transistor Q1 of the bypass circuit 13, and the resistor R2 of the monitor circuit 15 has the same resistance as the resistor R1 of the bypass circuit 13, but no limitation is placed on it, and it may be that the transistors Q1 and Q2 and the resistors R1 and R2 respectively have the input-output characteristics different from each other, and the monitor current Ian is found depending on a difference between the respective Input-output characteristics. In other words, for example, when the transistor Q2=Q1−2, and resistor R2=R1×0.5, the monitor current Im may be found.

$$Im = Ipd \times 2 + Im0 \quad (4)$$

The description is given that the BGR circuit 322A generates the control, voltage Vc1 as the configuration of the offset current circuit 32A, but the configuration for generating the control voltage Vc1 is not limited thereto, and another circuit may be used so long as it is a low voltage circuit capable of generating a predetermined constant voltage.

What is claimed is:

1. A transimpedance amplifier for converting an input current to an output voltage, comprising:
    a first amplifier configured to convert a current signal to a voltage signal;
    a single-to-differential converter configured to convert the voltage signal to a differential voltage signal that is output as the output voltage;
    a feedback circuit configured to generate a control signal from the differential voltage signal;

a bypass circuit configured to generate the current signal by subtracting a bypass current from the input current so that an average value of the current signal is maintained at a predetermined value;

a monitor circuit configured to generate a monitor current from the control signal, the monitor current being proportional to the bypass current; and an offset circuit configured to provide a reference voltage so that the bypass current is maintained at a constant value when the input current is null, wherein the single-to-differential converter includes a differential amplifier having a positive phase input and a negative phase input, the positive phase input receiving one of the voltage signal and the reference voltage, the negative phase input receiving the other of the voltage signal and the reference voltage, the differential amplifier generating the differential voltage signal by amplifying a voltage difference between the positive phase input and the negative phase input.

2. The transimpedance amplifier according to claim 1, wherein the monitor circuit is constituted by NPN-type bipolar transistors and resistors.

3. The transimpedance amplifier according to claim 2, wherein the offset circuit is constituted by NPN-type bipolar transistors and resistors.

4. The transimpedance amplifier according to claim 1, wherein the offset circuit includes:

an offset current circuit configured to provide an offset current substantially equal to the bypass current when the input current is null, and a second amplifier configured to generate the reference voltage from the offset current, the second amplifier having a same circuit structure as a circuit structure of the first amplifier so that the first amplifier and the second amplifier output a same output voltage when the first amplifier and the second amplifier receive a same input voltage, wherein the offset current is Ioffset, the bypass current is Ishunt0, and the input current is Ipd, and wherein the monitor circuit generates the monitor current Im substantially satisfying a formula, Ipd=Im−Ioffset.

5. The transimpedance amplifier according to claim 4, wherein the monitor circuit and the offset current circuit are constituted by NPN-type bipolar transistors and resistors.

6. The transimpedance amplifier according to claim 4, wherein the offset current circuit includes, a first current source configured to generate the offset current depending on a control voltage, and a constant voltage circuit configured to provide the control voltage.

7. The transimpedance amplifier according to claim 6, wherein the monitor circuit, the first current source, and the constant voltage circuit are constituted by NPN-type bipolar transistors and resistors.

8. The transimpedance amplifier according to claim 6, wherein the constant voltage circuit includes a band-gap reference circuit configured to output the control voltage maintained at a predetermined value.

9. The transimpedance amplifier according to claim 8, wherein the band-gap reference circuit is constituted by NPN-type bipolar transistors and resistors.

10. The transimpedance amplifier according to claim 6, wherein the constant voltage circuit includes, a second current source configured to generate a dummy current depending on the control voltage, the second current source having a same circuit structure as a circuit structure of the first current source so that the dummy current is substantially equal to the offset current, a resister to convert the dummy current flowing in the resister to an offset monitor voltage, an offset monitor terminal to output the offset monitor voltage to an external controller, and an offset control terminal to receive the control voltage from the external controller.

11. The transimpedance amplifier according to claim 10, wherein the second current source is constituted by NPN-type bipolar transistors and resistors.

* * * * *